(12) United States Patent
Huang et al.

(10) Patent No.: US 12,696,759 B2
(45) Date of Patent: Jul. 28, 2026

(54) SEMICONDUCTOR STRUCTURE HAVING LOW-RESISTANCE VIA CONTACT

(71) Applicant: Taiwan Semiconductor Manufacturing Company, Ltd., Hsinchu (TW)

(72) Inventors: Sheng-Kai Huang, Taichung (TW); Wei-Der Sun, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 394 days.

(21) Appl. No.: 18/230,673

(22) Filed: Aug. 7, 2023

(65) Prior Publication Data

US 2025/0054858 A1     Feb. 13, 2025

(51) Int. Cl.
| | |
|---|---|
| *H10W 20/40* | (2026.01) |
| *H10D 1/47* | (2025.01) |
| *H10W 20/41* | (2026.01) |
| *H10W 20/42* | (2026.01) |
| *H10W 20/00* | (2026.01) |

(52) U.S. Cl.
CPC .......... *H10W 20/498* (2026.01); *H10D 1/474* (2025.01); *H10W 20/42* (2026.01); *H10W 20/425* (2026.01); *H10W 20/075* (2026.01); *H10W 20/081* (2026.01)

(58) Field of Classification Search
CPC ............. H01L 23/5228; H01L 23/5226; H01L 23/53238; H01L 21/76802; H01L 21/76832; H10D 1/474; H10W 20/498; H10W 20/42; H10W 20/425; H10W 20/075; H10W 20/081
See application file for complete search history.

(56) References Cited

U.S. PATENT DOCUMENTS

| | | | |
|---|---|---|---|
| 2010/0019344 A1* | 1/2010 | Chuang ................ | H10D 84/811 |
| | | | 257/516 |
| 2021/0257296 A1* | 8/2021 | Chan ................... | H01L 23/5228 |
| 2022/0359387 A1 | 11/2022 | Chan et al. | |

FOREIGN PATENT DOCUMENTS

| | | |
|---|---|---|
| TW | 202324708 A | 6/2023 |

OTHER PUBLICATIONS

Office Action of TW Patent Application No. 113129460 DATED Apr. 23, 2025.

* cited by examiner

*Primary Examiner* — Patricia D Valenzuela
(74) *Attorney, Agent, or Firm* — Kilpatrick Townsend & Stockton LLP

(57)     ABSTRACT

Semiconductor structures having low resistance via contacts and methods of fabricating the same are provided. An example semiconductor structure includes a substrate, a dielectric layer disposed over the substrate, a resistor disposed in the dielectric layer, and a resistor via contact disposed in the dielectric layer the resistor. The resistor via contact further includes a first layer disposed on and in contact with the resistor, a second layer disposed on the first layer, and a third layer disposed on the second layer. The first layer has a first thickness and includes a first material having a first resistivity, the second layer has a second thickness and includes a second material, and the third layer has a third thickness and includes a third material having a second resistivity. The first thickness is more than the third thickness, and the first resistivity is less than the second resistivity.

20 Claims, 15 Drawing Sheets

SEMICONDUCTOR STRUCTURE HAVING LOW-RESISTANCE VIA CONTACT

FIELD

Embodiments of the present disclosure relate generally to semiconductor devices, and more particularly to via contacts for interconnecting conductive features between different layers of a semiconductor structure.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. There is always a need to improve the performance of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
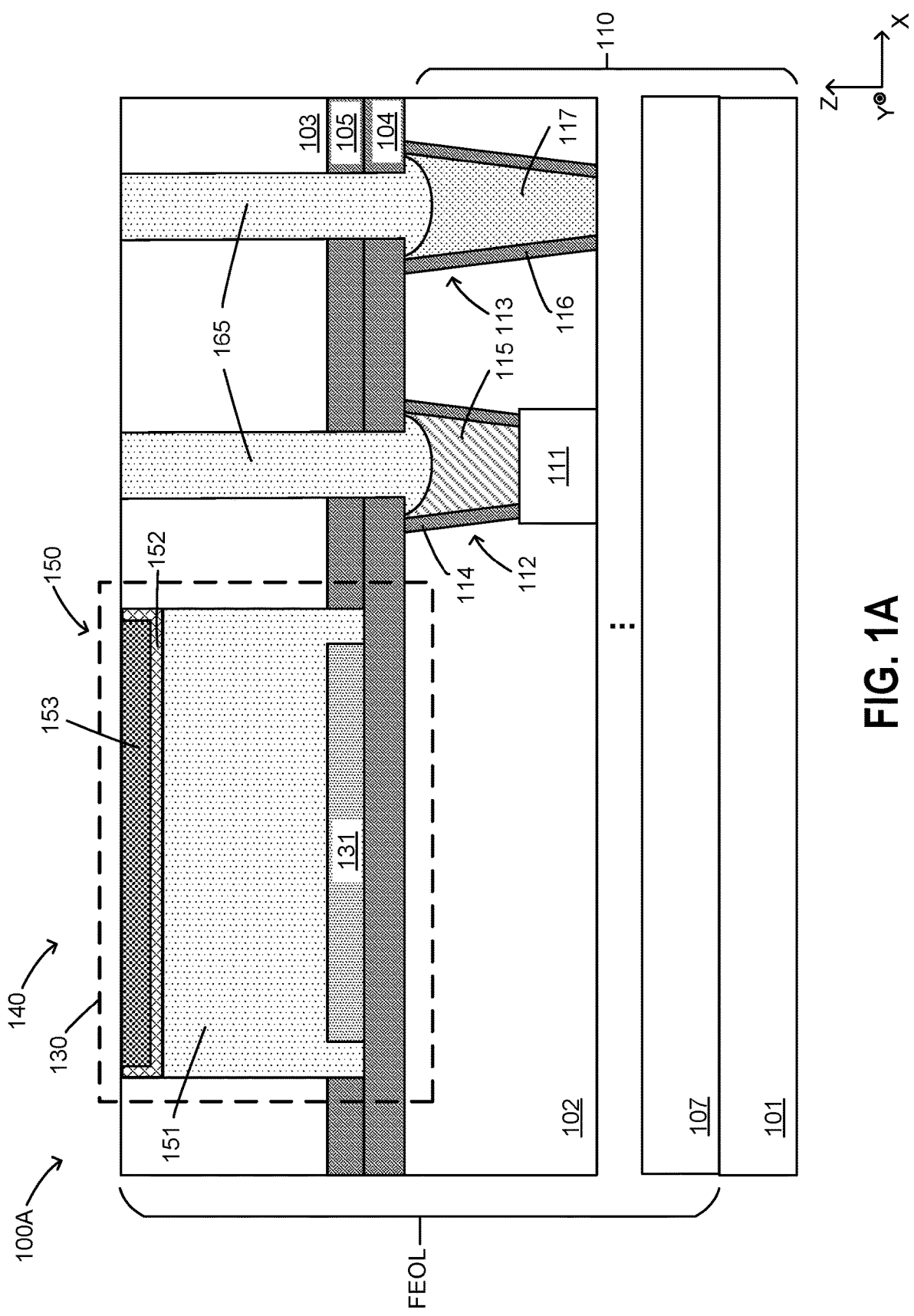
FIG. 1A is a schematic diagram illustrating a cross-section view of a layout of a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and may not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

In semiconductor devices, particularly radio frequency (RF) devices, resistors (sometimes also referred to as "high-resistance areas" or "HiR areas") are important passive elements. Resistors can be used for biasing, impedance matching, filtering, gain control, transmission line termination, noise reduction signal integrity improvement, frequency response application, and so on. A resistor disposed in one layer of the semiconductor device is often electrically connected to another active or passive element in the same or different layers of the semiconductor device through an intra-layer or inter-layer via contact coupled to the resistor. The via contacts may be used to connect to the resistors (also referred to as "resistor via contact") are often formed in a separate process from the formation of other via contacts used to connect to non-resistor elements (e.g., transistors) in the same semiconductor structure. In addition, resistor via contacts are typically composed of a conductive material with good acid resistance or etch resistance for the purpose of protecting the resistor via contact and the underlying resistor from acid corrosion and metal loss in subsequent fabrication processes. The acid-resistant materials of the resistor via contact often have relatively high resistivity compared with traditional materials used for non-resistor via contacts. Thus, the electrical resistance of the resistor via contact is non-negligible and sometimes can be considerably high.

In addition, the resistors used in RF devices may be relatively large in dimension. For example, a resistor according to the present disclosure may be a thin-film type of resistor having a large two-dimensional area, and the resistor contact vias connected to the resistor also have relatively large dimensions in order to provide sufficient physical contact area and electrical connectivity to the resistors. However, this may raise issues. Due to the relatively large dimension and/or the relatively high resistivity, the resistor via contact may be viewed as an additional resistor connected in series with the underlying resistor and may contribute to an unfavorable increase of the overall electrical resistance in the circuit and lead to substantial impact on the functional performance of the underlying resistor. In particular, the high electrical resistance of the resistor via contact may cause serious problems in RF devices that require resistors be in strict compliance to the specification (i.e., the designed resistance). The high electrical resistance of the resistor via contact may further cause instability of the device and low yield in the wafer acceptance testing (WAT) process.

One insight of the present disclosure is related to a novel heterogeneous resistor via contact having a multi-layer structure. According to some embodiments, the resistor via contact may have a first layer disposed on the underlying resistor, a second layer disposed on the first layer, and a third layer disposed on the second layer. The first layer may constitute a substantial portion of the resistor contact structure and includes a conductive material having a low resistivity; the second layer serves as a glue layer between the first and third layers to improve the bonding strengths therebetween; the third layer serves as a protective layer and includes an acid-resistant material for protecting the resistor contact structure and the underlying resistor from corrosion in subsequent fabrication processes. The heterogeneous resistor contact structure according to the present disclosure has a substantially lower electrical resistance compared with the traditional resistor via contact, without sacrificing the acid-resistant performance.

Another insight provided in the present disclosure is related to a heterogeneous resistor contact structure having a pattern of multiple resistor via contacts in relatively smaller dimensions. The multiple smaller via contacts can further reduce the resistance and capacitance of the resistor contact structure and provide better electrical connectivity for the underlying resistor compared to a single large via contact. In addition, a pattern of multiple smaller via contacts allows for higher device density on the semiconductor structure, provides better thermal conductivity compared to a single large via contact, enables better heat dissipation from the semiconductor structure, reduces the risk of overheating, improves the overall thermal performance, and potentially reduces manufacturing costs.

Example Semiconductor Structures Having Low-Resistance Via Contacts

Figure 1B:
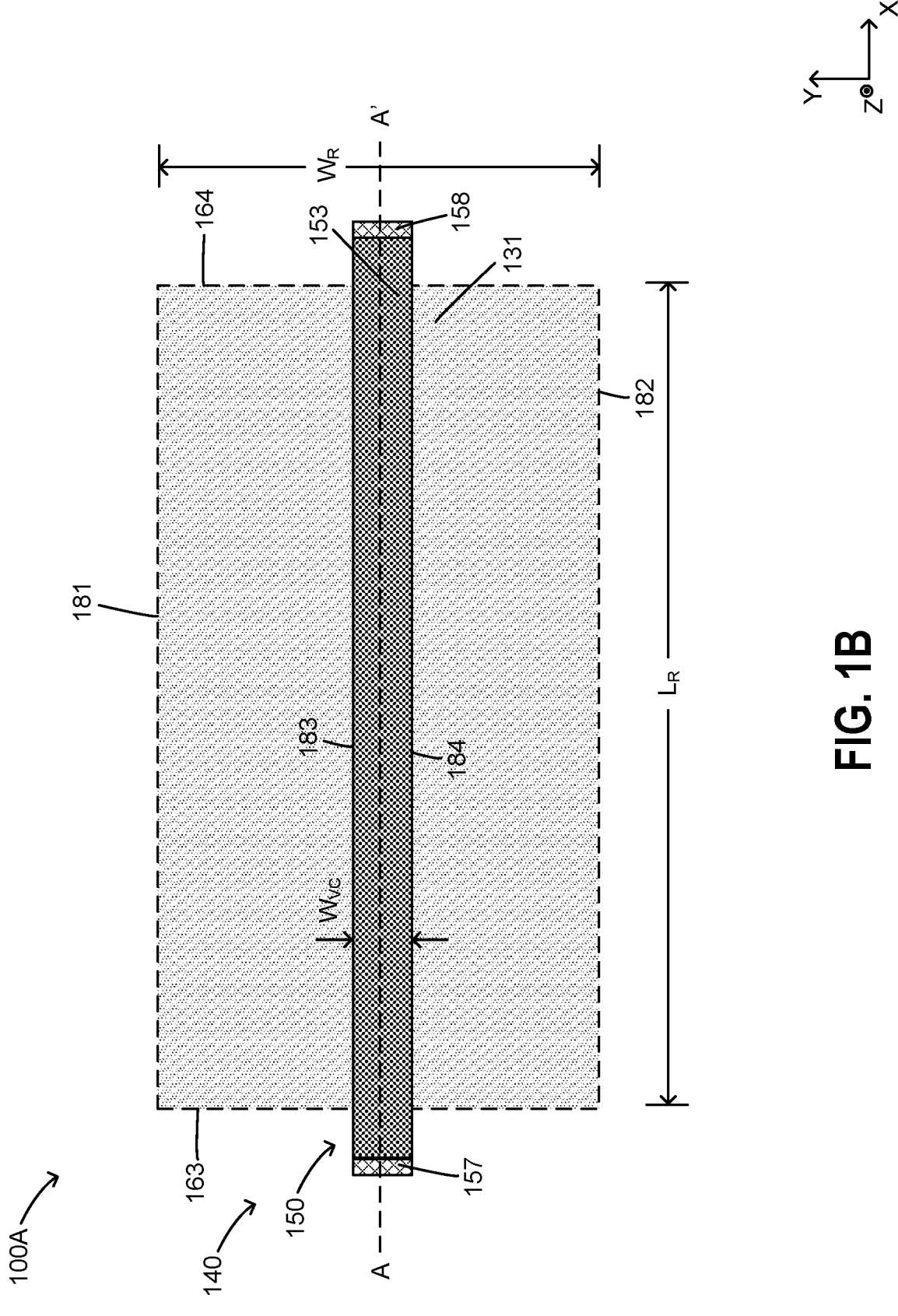
FIG. 1B is a schematic diagram illustrating a top view of a region of the semiconductor structure of FIG. 1A, in accordance with some embodiments.
Figure 1C:
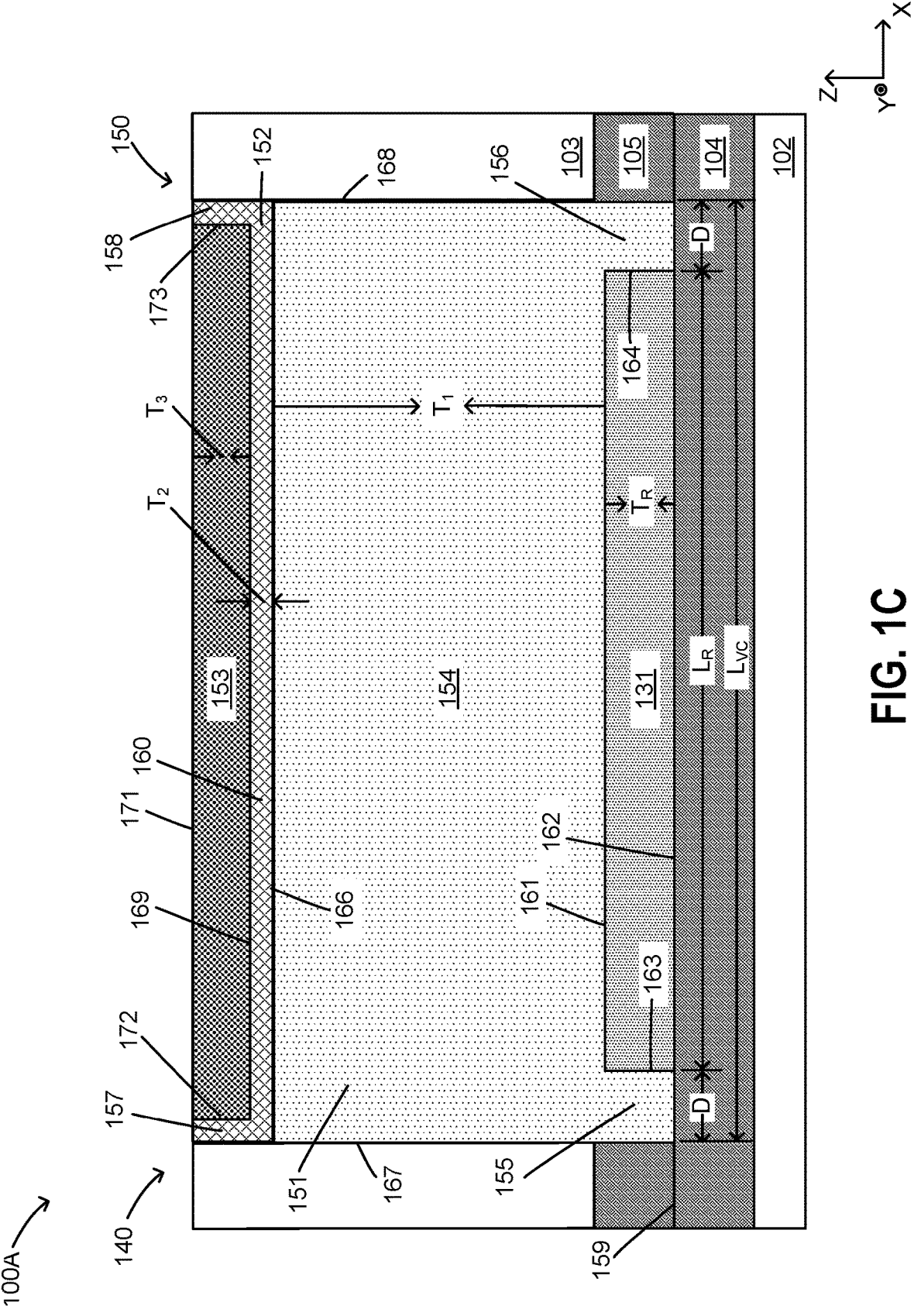
FIG. 1C is a schematic diagram illustrating a cross-sectional view of a region of the semiconductor structure of FIG. 1A, in accordance with some embodiments.

FIGS. 1A-1C illustrate an example semiconductor structure 100A including a contact structure 140 (also referred to as "resistor contact structure," "contact assembly," "resistor contact assembly," or an equivalent thereof) disposed on a resistor 131 in accordance with some embodiments of the present disclosure. FIG. 1A illustrates a cross-sectional view of the semiconductor structure 100A. FIG. 1B illustrates a top view of a layout of a selected region 130 of the semiconductor structure 100A and the position of the resistor contact structure 140 relative to the resistor 131. FIG. 1C illustrates a cross-sectional view of the region 130 of the semiconductor structure 100A along the line A-A' of FIG. 1B.

In the illustrated example, the semiconductor structure 100A includes, among other components, a workpiece 110. The workpiece 110 may include a substrate 101, at least one dielectric layer (e.g., the dielectric layer 102), one or more metal gates 111, and multiple conductive features 112 and 113. In some embodiments, the semiconductor structure 100A further includes at least one contact etch stop layer (CESL), for example, CESL 104 and CESL 105 disposed on the workpiece 110. The semiconductor structure 100A further includes a dielectric layer 103 disposed on the CESL 105 and at least one via contact 165 disposed in the dielectric layer 103. In some embodiments, the resistor 131 is disposed on the CESL 105 and above the workpiece 110. The resistor contact structure 140 is disposed on the resistor 131 and within the dielectric layer 103. The resistor contact structure 140 is electrically coupled to the resistor and is configured to electrically connect the resistor to another active or passive element in the semiconductor structure 100A. The resistor contact structure 140 may include one or more resistor via contacts 150, and each resistor via contact may further include, among other components, a first layer 151, a second layer 152, and a third layer 153, sequentially stacked on the resistor 131. More examples of the resistor contact structure 140 and the resistor via contact 150 will be described in detail with references to FIGS. 1B-1C.

The substrate 101 may be a silicon substrate (e.g., a silicon wafer) in some embodiments. Alternatively, the substrate 101 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In embodiments, the substrate 101 may include indium tin oxide (ITO) glass, include silicon on insulator (SOI) substrate, be strained and/or stressed for performance enhancement, include epitaxial regions, doped regions, and/or include other suitable features and layers.

The dielectric layers 102 and 103 are formed over the substrate 101 and are also referred to as interlayer dielectric (ILD) layers. Each of the ILD layers 102 and 103 may include an oxide derived from tetraethylorthosilicate (TEOS) (e.g., an oxide layer formed using TEOS as a precursor), un-doped silicate glass, or doped silicon oxide such as borophosphosilicate glass (BPSG), fluorinated silicate glass (FSG), phosphosilicate glass (PSG), borosilicate glass (BSG), and/or other suitable dielectric materials. Each ILD layer may be formed by plasma enhanced CVD (PECVD), flowable CVD (FCVD), or other suitable methods. The ILD layers 102 and 103 may have the same or different materials.

The one or more metal gates 111 may be connected to one or more active/passive devices (not shown) built in or on an active region. The active and/or passive devices may include one or more transistors such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, gate-all-around FETs (GAAFET), bipolar transistors, high voltage transistors, high-frequency transistors, static random access memory (SRAM) cells, other memory cells, resistors, capacitors, and inductors.

The conductive features 112 and 113 are electrically coupled to the metal gate 111 and/or other features in the workpiece 110 and are configured to provide an electrical path by connecting the metal gate 111 with other devices or functional components in a different dielectric layer of the semiconductor structure 100A. In some embodiments, the metal gate 111 may be a part of a transistor (not shown). The transistor may further include source/drain (S/D) features and other transistor gate features. In some embodiments, the metal gate 111 is in a form of a gate structure or gate stack and further include gate spacers. In some embodiments, the conductive feature 112 is electrically connected to the metal gate 111 of the transistor, and the conductive feature 113 is electrically coupled to a S/D feature of the same transistor or a different transistor.

The conductive feature 112 may include a plug 115 and a barrier layer 114 disposed on a sidewall of the plug 115. Likewise, the conductive feature 113 may include a plug 117 and a barrier layer 116 disposed on a sidewall of the plug 117. The plugs 115 and 117 may each include a conductive material such as a metal, a metal compound, or a metal alloy. Examples of the conductive material include but are not limited to Aluminum (Al), Nickel (Ni), Gold (Au), Silver (Ag), Copper-tin (Cu—Sn) alloy. The barrier layers 114 and 116 are configured to respectively prevent inter-diffusion between the plugs 115 and 117 and the dielectric layer 102. Examples of the barrier layers 114 and 116 include but are not limited to Titanium/Tungsten (Ti/W), Titanium Nitride (TiN), Tantalum/Tantalum Nitride (Ta/TaN), Cobalt/Chromium (Co/Cr), Cobalt Silicide (CoSi$_x$ such as CoSi, CoSi$_2$, and/or Co$_2$Si). In some embodiments, the plug 117 is a S/D contact electrically connected to a S/D feature of a transistor (not shown) in the active region.

The via contacts 165 extend through the dielectric layer 103 and are coupled to the conductive features 112 and 113, respectively. The via contacts 165 are configured to electrically connect the conductive features 112 and 113 in dielectric layer 102 to other functional elements in or above the dielectric layer 103. The via contacts 165 may include a conductive portion and a barrier layer disposed on a sidewall of the conductive portion. The conductive portion of the via contacts 165 is similar to the plugs 115, and the barrier layer of the via contacts 165 is similar to the barrier layer 114 as described above. The via contacts 165 may be formed by performing a patterning and etching process to form openings in the dielectric layer 103 vertically aligned with the conductive features 112 and 113, depositing a barrier layer on the bottom wall and sidewall of the opening using a suitable technique such as sputtering, chemical vapor deposition (CVD), physical vapor deposition (PVD), or atomic layer deposition (ALD), depositing a conductive layer including a conductive material such as metal into the opening and over the barrier layer, and performing a planarization process (e.g., a chemical-mechanical polishing (CMP) process) to remove excess conductive layer to create a smooth and substantially flat surface for subsequent processing steps.

The CESLs 104 and 105 serve as a stop layer during an etching process for forming a functional element of the semiconductor structure 100A. Each of the CESLs 104 and 105 is configured to prevent the etch from penetrating too deeply into the underlying layers of the device and is typically designed to have a different etch rate than the underlying layers, so that the etch stops when it reaches the CESL. The CESL may include silicon nitride, silicon oxynitride, silicon nitride with oxygen (O) or carbon (C) elements, and/or other materials; and may be formed by CVD, PVD, ALD, or other suitable methods. In some embodiments, the CESLs 104 and 105 include different materials.

The resistor 131 is disposed over the workpiece 110. The resistor 131 may be in a form of a layer, a film, or a two-dimensional area in the horizontal direction (i.e., the X-Y direction shown in FIGS. 1A and 1). The resistor 131 includes a conductive material having a relatively high resistivity, such as a metal, a metal compound, or a metal alloy. In the illustrated example, the resistor 131 extends in a first horizontal direction (i.e., the X-direction of FIG. 1C) from a first end 163 (also referred to as a "first side wall" 163) to a second end 164 (also referred to as a "second side wall" 164). The resistor 131 extends in a second horizontal direction (i.e., the Y-direction of FIG. 1B) from a first side 181 to a second side 182. The resistor 131 extends in a vertical direction (i.e., the Z-direction of FIG. 1C) from a top surface 161 to a bottom surface 162. In some embodiments, the bottom surface 162 is substantially aligned with a top surface 159 of the CESL 104. In some embodiments, the resistor 131 is formed in the dielectric layer 103 without a CESL, and the bottom surface 162 is substantially aligned with a bottom surface of the dielectric layer 103.

The resistor 131 has a length ($L_R$, also referred to as a "first horizontal critical dimension" or a "first horizontal CD"), measured by a horizontal distance between the first end 163 and the second end 164 along the X-direction. The resistor 131 has a width ($W_R$, also referred to as a "second horizontal critical dimension" or a "second horizontal CD"), measured by a horizontal distance between a first side 181 to a second side 182 along the Y-direction. The resistor 131 also has a thickness ($T_R$), measured by a vertical distance between the top surface 161 and the bottom surface 162. In some embodiments, the top surface 161 is aligned with or below a top surface of the CESL 105. In other words, $T_R$ of resistor 131 is equal to or smaller than the thickness of the CESL 105. Alternatively, $T_R$ of resistor 131 may be larger than the thickness of the CESL 105. The $L_R$, $W_R$, and $T_R$ may vary. In some embodiments, $L_R$ has a value from about 3 nm to about 2,000 nm. In some embodiments, $W_R$ has a value from about 3 nm to about 2,000 nm. In some embodiments, $L_R$ has a value of at least 1 nm.

Only one resistor 131 is shown in FIG. 1A; however, multiple resistors 131 may be formed across a surface of the workpiece 110, depending on the application of the semiconductor structure 100A. The resistor 131 may be formed proximate to the metal gate 111 in some embodiments. The resistor 131 may include a conductive material having a resistance comparable to a resistance of a polysilicon resistor, and may be used to replace polysilicon resistors used in radio-frequency applications. In some embodiments, the resistor 131 has a sheet resistance of about 200 to 1,000 ohms per square ($\Omega$/sq), for example. Alternatively, the resistor 131 may include other sheet resistance values, depending on factors such as the type of material, the dimension, and/or the thickness of the conductive material, as examples. In some embodiments, the resistor 131 is formed in a Front-End-Of-Line (FEOL) process. Alternatively, the resistor 131 may be formed in a Middle-End-Of-Line (MEOL) or a Back-End-Of-Line (BEOL) process, rather than an FEOL process. In some embodiments, the resistor 131 includes at least one of Ti, Ta, Ni, Co, W, Mn, Cu, Ag, Si, or any combinations thereof. In some embodiments, the resistor 131 includes polysilicon.

In some embodiments, the resistor 131 is formed directly on or within a shallow trench isolation (STI) layer 107 disposed on or formed within the substrate 101. The STI layer 107 may be formed by etching shallow trenches into the substrate 101 and filling the shallow trenches with an insulating material such as oxide. The STI layer 107 is commonly used for isolating active semiconductor devices (such as transistors) from each other to prevent interference and current leakage between adjacent devices. According to the present disclosure, the resistor 131 may be formed directly on or within the STI layer 107 by deposition, ion implantation, or other processes. The STI layer 107 may further isolate the resistor 131 from other active or passive devices from each other. In some embodiments, No CESL is formed between the resistor 131 and the STI layer 107. The resistor contact structure 140 is also formed in the same dielectric layer where the resistor 131 is formed. The resistor contact structure 140 may electrically connect the resistor 131 to another device of functional element in another dielectric layer above the dielectric layer where the resistor 131 is formed.

In the illustrated example, the resistor contact structure 140 includes a resistor via contact 150 disposed over and in physical contact with the resistor 131. The resistor via contact 150 extends continuously from a first side 167 to a second side 168 along the X-direction and has a length ($L_{VC}$) measured by a distance between the first side 167 and the second side 168. The resistor via contact 150 extends horizontally from a first side 183 to a second side 184 along the Y-direction and has a width ($W_{VC}$) measured by a distance between the first side 183 and the second side 184 in the Y-direction. The first side 167 is proximate to the first end 163 of the resistor 131, and the second side 168 is proximate to the second end 164 of the resistor 131. The resistor via contact 150 extends vertically from a top surface 171 to a bottom surface aligned with the bottom surface 162 of the resistor 131.

In some embodiments, each resistor via contact 150 of the resistor contact structure 140 includes, among other components, at least three layers (e.g., the first layer 151, the second layer 152, and the third layer 153) sequentially stacked in the vertical direction (i.e., the Z-direction of FIG. 1C). The first layer 151 is disposed over the resistor 131, the second layer 152 is disposed on the first layer 151, and the third layer is disposed on the second layer 152. The first layer 151 and the second layer 152 share a first interface 166, and the second layer 152 and the third layer 153 share a second interface 169 above the first interface 166.

The first layer 151 may extend horizontally from the first side 167 to the second side 168 and has the same length as $L_{VC}$. In some embodiments, the $L_{VC}$ of the resistor via contact 150 is larger than the $L_R$ of the resistor 131. In some embodiments, a ratio of $L_{VC}$ to $L_R$ ($L_{VC}/L_R$) is at least 1.1, at least 1.2, at least 1.5, or at least 2. In some embodiments, the first layer 151 has a main portion 154 and two side portions (i.e., the first side portion 155 and the second side portion 156). The main portion 154 is between the interface 166 and the top surface 161 of the resistor 131. The two side portions 155 and 156 are respectively disposed on the first end 163 and the second end 164 of the resistor 131. The first side portion 155 extends vertically from the top surface 161 to the bottom surface 162 and horizontally from the first side 167 to the first end 163 along the X-direction. Likewise, the second side portion 156 extends vertically from the top surface 161 to the bottom surface 162 and horizontally from the second side 168 to the second end 164 along the X-direction. The side portions 155 and 156 may have a horizontal dimension (D), measured by a distance measured between the first side 167 and the first end 163 or between the second side 168 and the second end 164. In some embodiments, D is from about 0 to about 1,000 nm. The first layer 151 has a first thickness ($T_1$) measured by a distance between the interface 166 and the top surface 161 of the resistor 131. In some embodiments, $T_1$ is from about 0.3 nm to about 100 nm.

Similar to the first layer, the second layer 152 extends horizontally from the first side 167 to the second side 168 and vertically from the top surface 171 to the first interface 166. The third layer 153 extends horizontally from a first end 172 to a second end 173 and vertically from the top surface 171 to the second interface 169. The second layer 152 includes a main portion 160 between the second interface 169 and the first interface 166 and two side portions 157 and 158 respectively disposed on the first end 172 and the second end 173 of the third layer 153. In other words, the third layer 153 has a length along the X-direction smaller than the $L_{VC}$ of the resistor via contact 150 and is partially enclosed by the second layer 152. In some embodiments, the side portions 157 and 158 of the second layer 152 have a horizontal dimension (e.g., measured by a distance from the first side 167 to the first end 172 or a distance from the second side 168 to the second end 173) from about 0 nm to about 30 nm.

The second layer 152 has a second thickness ($T_2$) measured by a vertical distance between the second interface 169 to the first interface 166. In some embodiments, $T_2$ is substantially smaller than $T_1$ with a value from about 0 nm (e.g., one or a few layers of atoms) to about 20 nm. The third layer 153 has a third thickness ($T_3$) measured by a vertical distance between the top surface 171 and the second interface 169. In some embodiments, $T_3$ is from about 0 nm (e.g., one or a few layers of atoms) to about 50 nm. In some embodiments, the resistor via contact 150 may have a total thickness ($T_{VC}$), measured by the sum of $T_1$, $T_2$, and $T_3$, (i.e., $T_1+T_2+T_3$), from about 0.3 nm to about 170 nm. In some embodiments, the first layer 151 may constitute a majority of the resistor via contact 150. In some embodiments, the first layer 151 may constitute at least 50%, at least 60%, at least 70%, at least 80%, or at least 90% of the total volume of the resistor via contact 150.

In some embodiments, the first layer 151 includes a first material, the second layer 152 includes a second material, and the third layer 153 includes a third material. The first material, the second material, and the third material may be a conductive material such as a metal, a metal compound, or a metal alloy. In some embodiments, the first material is different from the third material. In some embodiments, the first material and the second material are the same in elemental composition (i.e., the same chemical element(s)) but different in crystal structure. In some embodiments, the first material has a first resistivity, the third material has a second resistivity, and the first resistivity is at least 3% less than the second resistivity. In some embodiments, the first resistivity is at least 5%, at least 10%, at least 15%, at least 20%, at least 25%, at least 30%, at least 40%, at least 50%, at least 75%, at least 90%, or at least 95%, less than the second resistivity. In some embodiments, the first layer 151 has a first electrical resistance value, the third layer 153 has a second electrical resistance value, and the first electrical resistance value is less than the second electrical resistance value by at least 3%, at least 5%, at least 10%, at least 15%, at least 20%, at least 25%, at least 30%, at least 40%, at least 50%, at least 75%, at least 90%, or at least 95%.

In some embodiments, the first material includes at least one of W, Mn, Cu, Ag, Co, Ni, $T_1$, Ta, or any combinations thereof. In some embodiments, the third material includes at least one of W, Mn, Cu, Ag, Co, Ni, $T_1$, Ta, or any combinations thereof. In some embodiments, the first layer 151 and the third layer 153 both include a metal. The metal has two crystal structures (i.e., a first crystal structure and a second crystal structure) different from each other. For example, the first crystal structure is characterized by a body-centered cubic (BCC) lattice with all three interaxial angles (i.e., α, β, γ) of 90 degrees. The second crystal structure is characterized by a face-centered cubic (FCC) lattice with all three interaxial angles (i.e., α, β, γ) of 90 degrees. It should be noted that other crystal structures are also possible, such as simple cubic (SC) lattice, tetragonal lattices, orthorhombic lattices, rhombohedral lattices, hexagonal lattices, monoclinic lattices, triclinic lattices.

In some embodiments, the first layer 151 has a first mass ratio of the first crystal structure to the second crystal structure, the third layer 153 has a second mass ratio of the first crystal structure to the second crystal structure, and the first mass ratio is different from the second mass ratio. In some embodiments, the first mass ratio is less than 1, and the second mass ratio is more than 1. In some embodiments, the first mass ratio is less than 0.5. In some embodiments, the second mass ratio is more than 2. In some embodiments, the resistor via contact 150 has a total resistance substantially smaller than the resistance of the resistor 131. In some embodiments, the resistor via contact 150 has a total resistance of at least 50%, at least 75%, at least 95%, or at least 99% less than the resistance of the resistor 131.

In some embodiments, the third layer 153 may serve as a protective layer, the third material of the third layer 153 may include a metal that is acid-resistant or etch-resistant. The acid-resistance or etch-resistance property of the third layer may enable protection of the resistor via contact from metal loss in the subsequent BEOL acid/etching process.

As mentioned above, the second layer 152 may serve as a glue layer (also referred to as a "tie layer," an "adhesive layer," or a "bonding layer") to improve the bonding between the first layer 151 and the third layer 153. In some embodiments, the second material is different from the first material and/or the third material. In some embodiments, the second material includes both the first material and the third material, and thus the second layer 152 serves as a transition layer between the first layer 151 and the third layer 153. In some embodiments, the second material includes at least one of $T_1$, Ta, Ni, Co, W, Mn, Cu, Ag, Si, or any combinations thereof.

The difference in the metal and/or crystal structure between the first layer 151 and the third layer 153 may contribute to the heterogeneous nature of the resistor via contact 150 and the resistor contact structure 140. Due to the substantially low resistance of the first layer 151 that constitutes a majority of the resistor via contact 150, the overall resistance of the resistor via contact 150 can be significantly lowered, as compared to the conventional resistor via contact having materials of relatively high resistivity. Therefore, the heterogeneous resistor via contact according to the present disclosure may improve the stability, durability, and functional performance of the resistor, improve the overall yield of wafer acceptance testing (WAT), and improve the consistency in the semiconductor fabrication process.

Figure 1D:
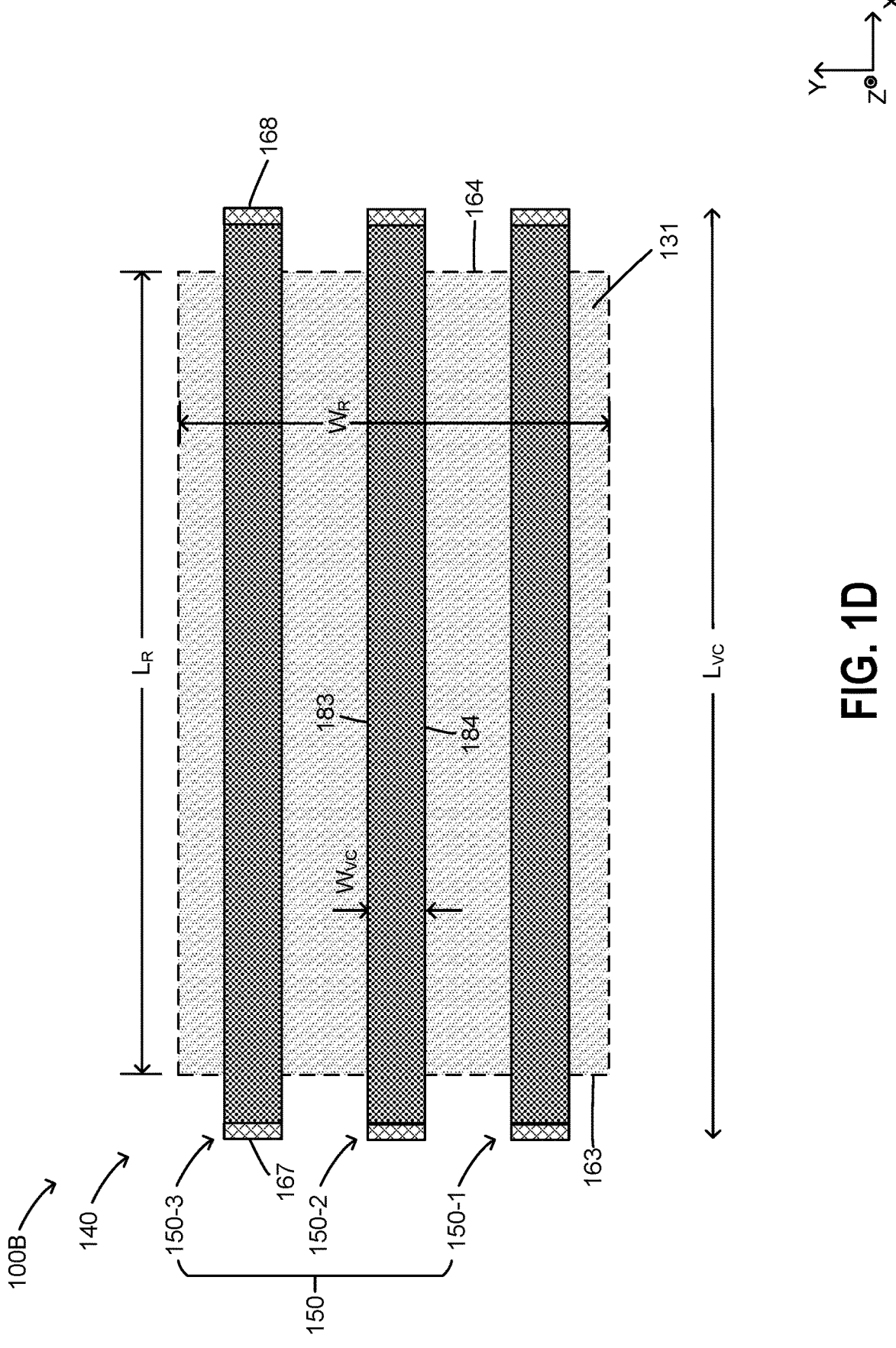
FIG. 1D is a schematic diagram illustrating a top view of another example semiconductor structure, in accordance with some embodiments.

FIG. 1D illustrates a top view of a layout of another example semiconductor structure 100B according to some embodiments. The semiconductor structure 100B is a close variation of the semiconductor structure 100A shown in FIGS. 1A-1C and may include any one or more components of the semiconductor structure 100A described above. In the illustrated example, the semiconductor structure 100B includes, among other components, a resistor 131 and a resistor contact structure 140 disposed over the resistor 131. The resistor contact structure 140 include multiple resistor via contacts 150 (i.e., the resistor via contacts 150-1, 150-2, and 150-3) arranged and aligned in a column along the Y-direction. The resistor via contacts 150 parallelly extend in the X-direction. Details of the resistor via contacts 150 are described above with reference to FIGS. 1B-1C and will not be repeated here. The total number of the resistor via contacts 150 may vary, for example, from 2 to 20.

Figure 2:
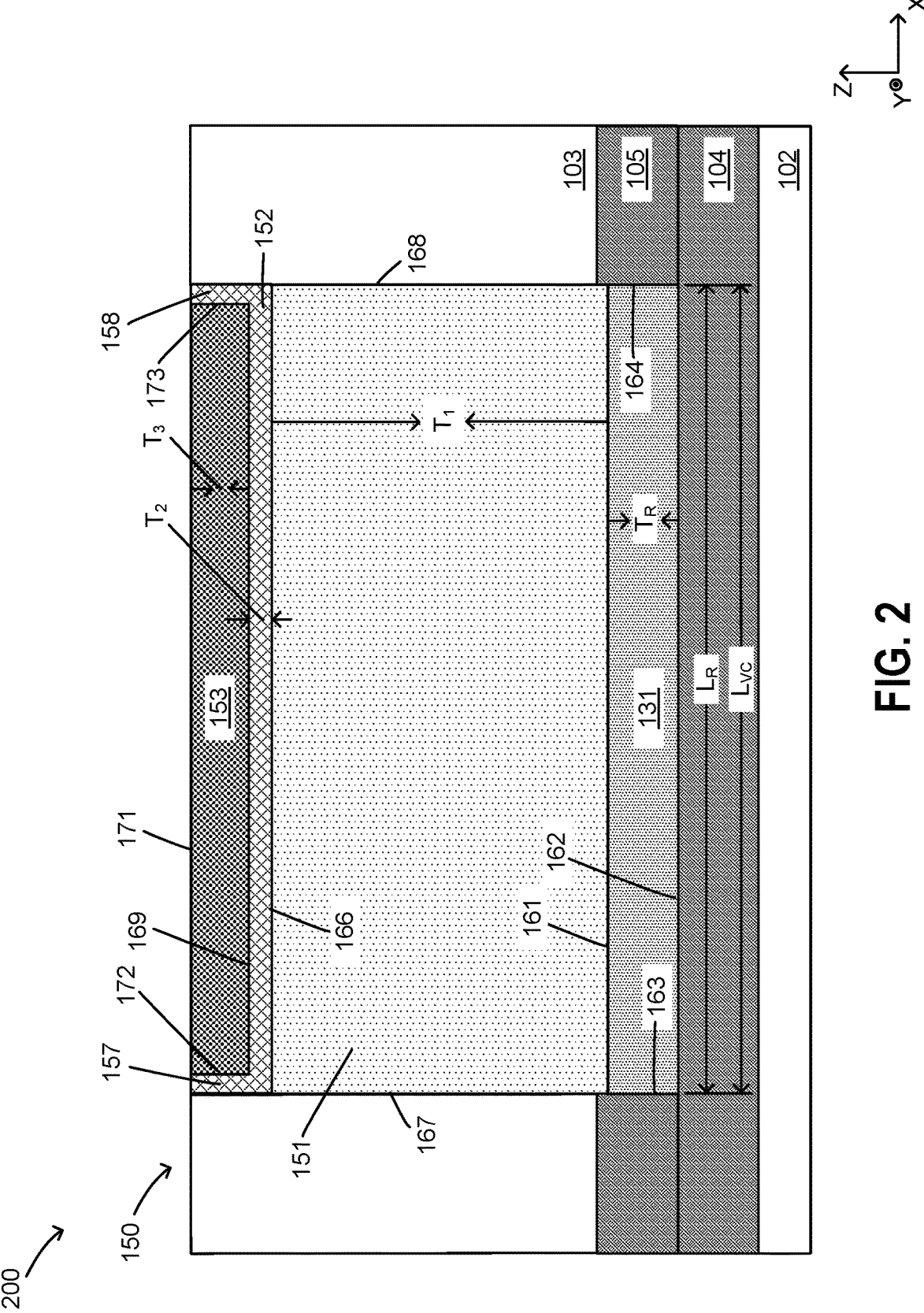
FIG. 2 is a schematic diagram illustrating a cross-sectional view of another example semiconductor structure, in accordance with some embodiments.

FIG. 2 illustrates a cross-sectional view of another example semiconductor structure 200 according to some embodiments. The semiconductor structure 200 is a variation of the semiconductor structures 100A and 100B shown in FIGS. 1A-1D and may include any one or more components of the semiconductor structures 100A and 100B described above. Details of the components of the semiconductor structure 200 will not be repeated unless otherwise indicated. In the illustrated example, the resistor via contact 150 has a length ($L_{VC}$) that is substantially the same as the $L_R$ of the resistor 131. In other words, the first side 167 and second side 168 of the resistor via contact 150 are respectively aligned with the first end 163 and the second end 164 of the resistor 131. The first layer 151 does not have a side portion that covers the first end 163 or the second end 164 of the resistor 131. Similar to the semiconductor structure 100B, the resistor contact structure 140 may include multiple resistor via contacts 150 arranged and aligned in a column along the Y-direction.

Figure 3:
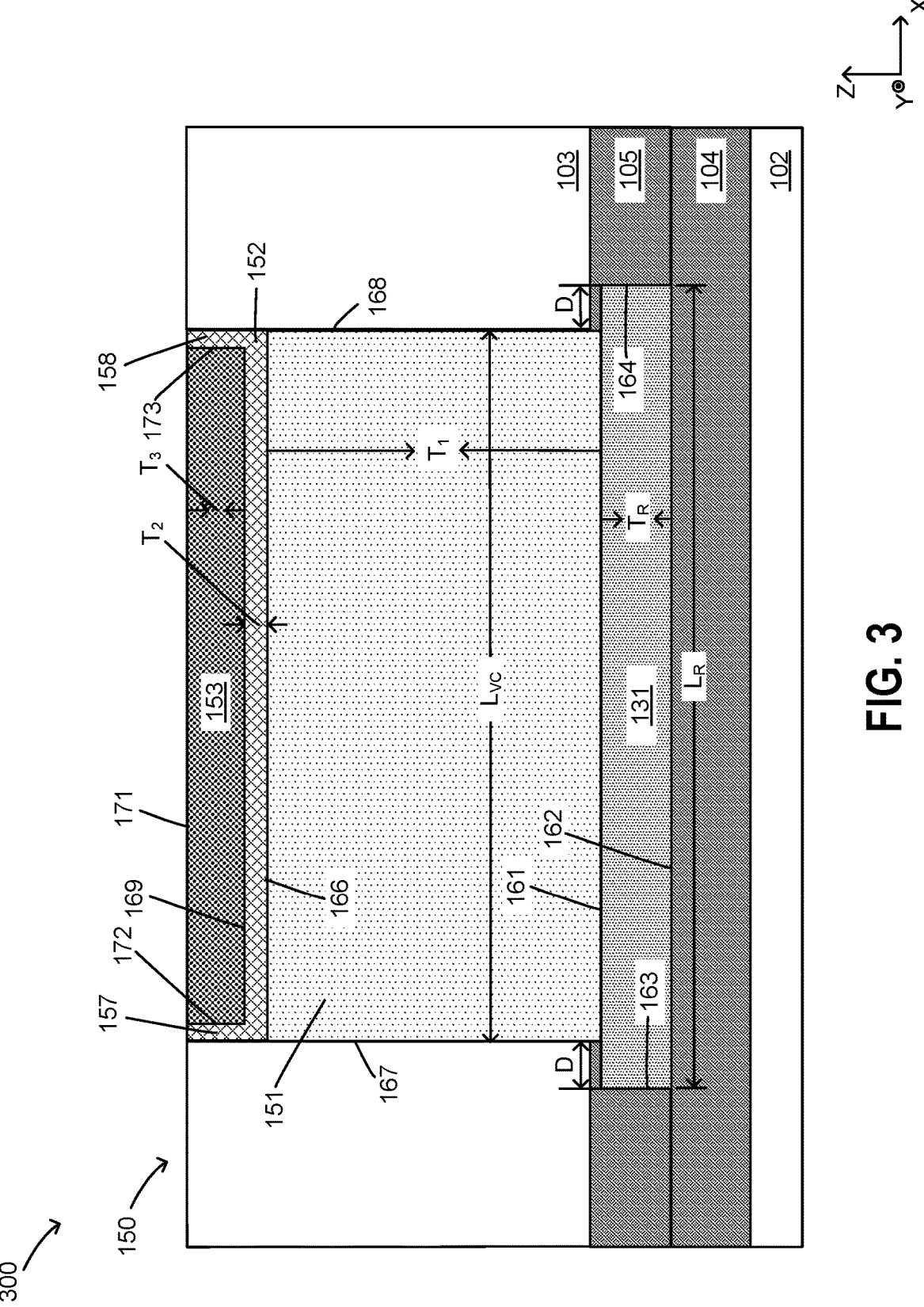
FIG. 3 is a schematic diagram illustrating a cross-sectional view of another example semiconductor structure, in accordance with some embodiments.

FIG. 3 illustrates a cross-sectional view of another example semiconductor structure 300 according to some embodiments. The semiconductor structure 300 is a variation of the semiconductor structure 200 shown in FIG. 2 and may include any one or more components of the semiconductor structure 200 described above. Details of the components of the semiconductor structure 300 will not be repeated unless otherwise indicated. In the illustrated example, the resistor via contact 150 has a length ($L_{VC}$) that is less than the $L_R$ of the resistor 131. In some embodiments, a ratio of $L_{VC}$ to $L_R$ ($L_{VC}/L_R$) is at least 0.5, at least 0.6, at least 0.7, at least 0.8, or at least 0.9. Similar to the semiconductor structure 200, the resistor contact structure 140 may include multiple resistor via contacts 150 arranged and aligned in a column along the Y-direction. A distance (D) between the first side 167 and the first end 163 or between the second side 168 and the second end 164 may be from about 0 to about 1,000 nm.

Figure 4A:
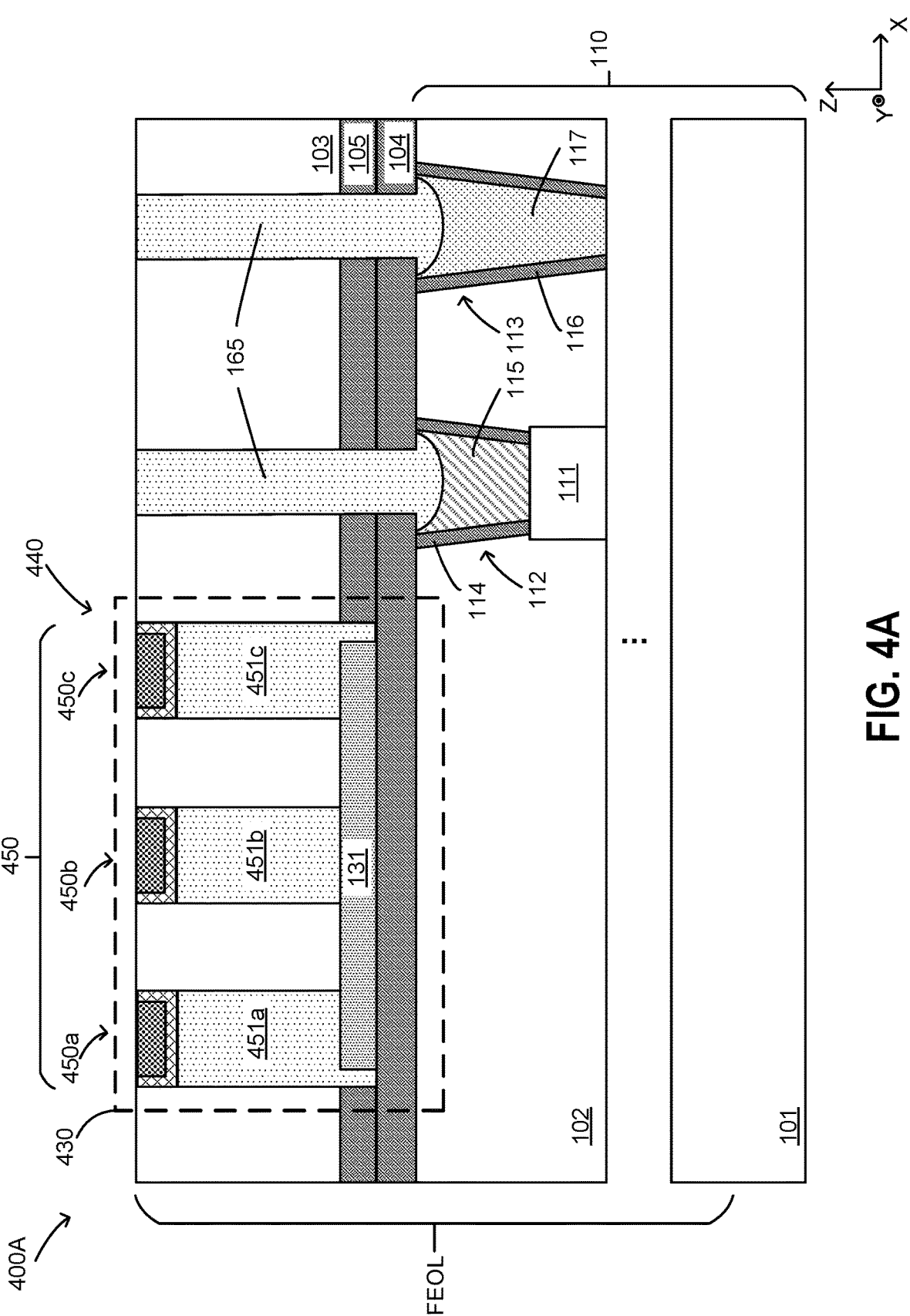
FIG. 4A is a schematic diagram illustrating a cross-section view of a layout of a semiconductor structure, in accordance with some embodiments.
Figure 4B:
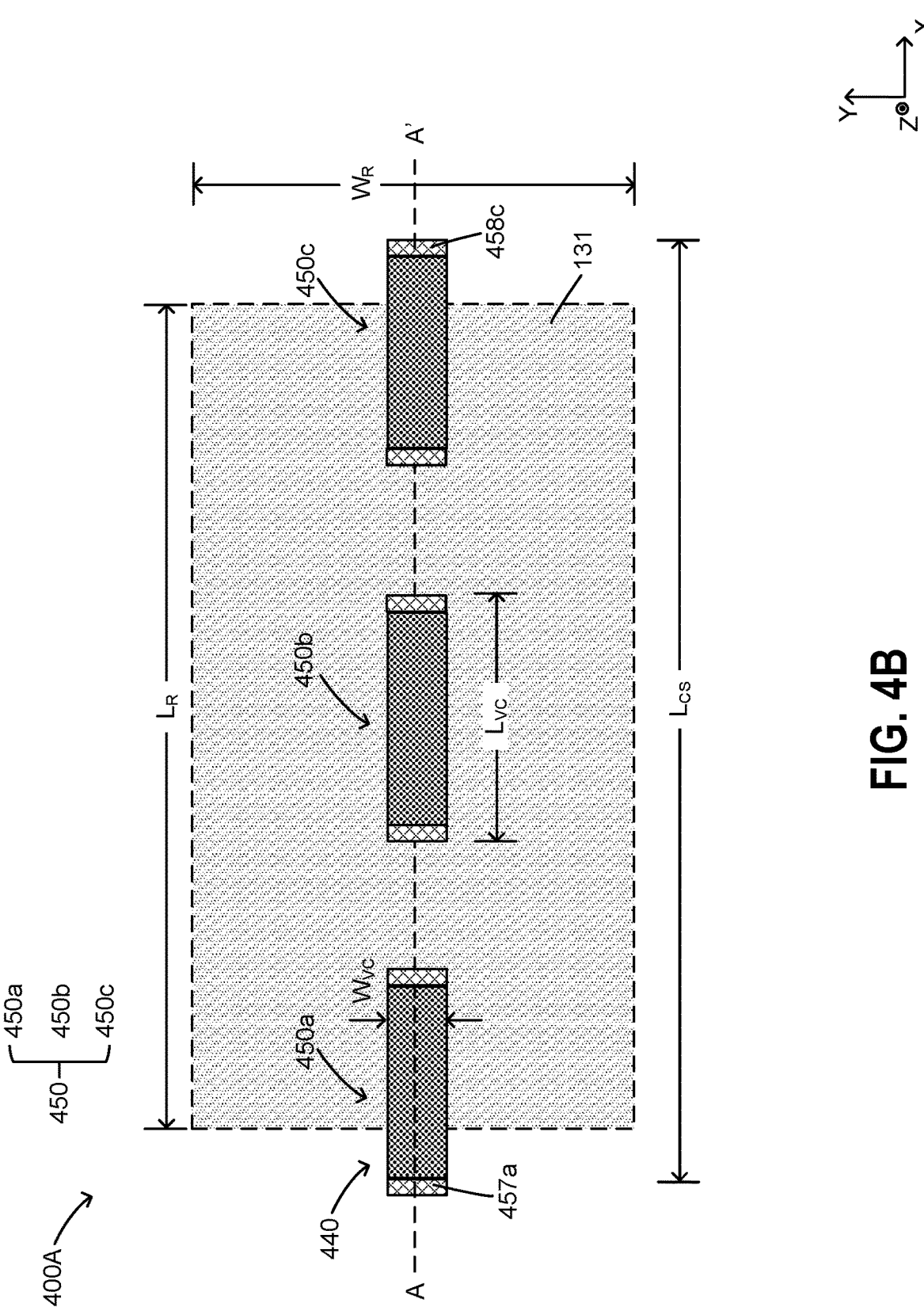
FIG. 4B is a schematic diagram illustrating a top view of a region of the semiconductor structure of FIG. 4A, in accordance with some embodiments.
Figure 4C:
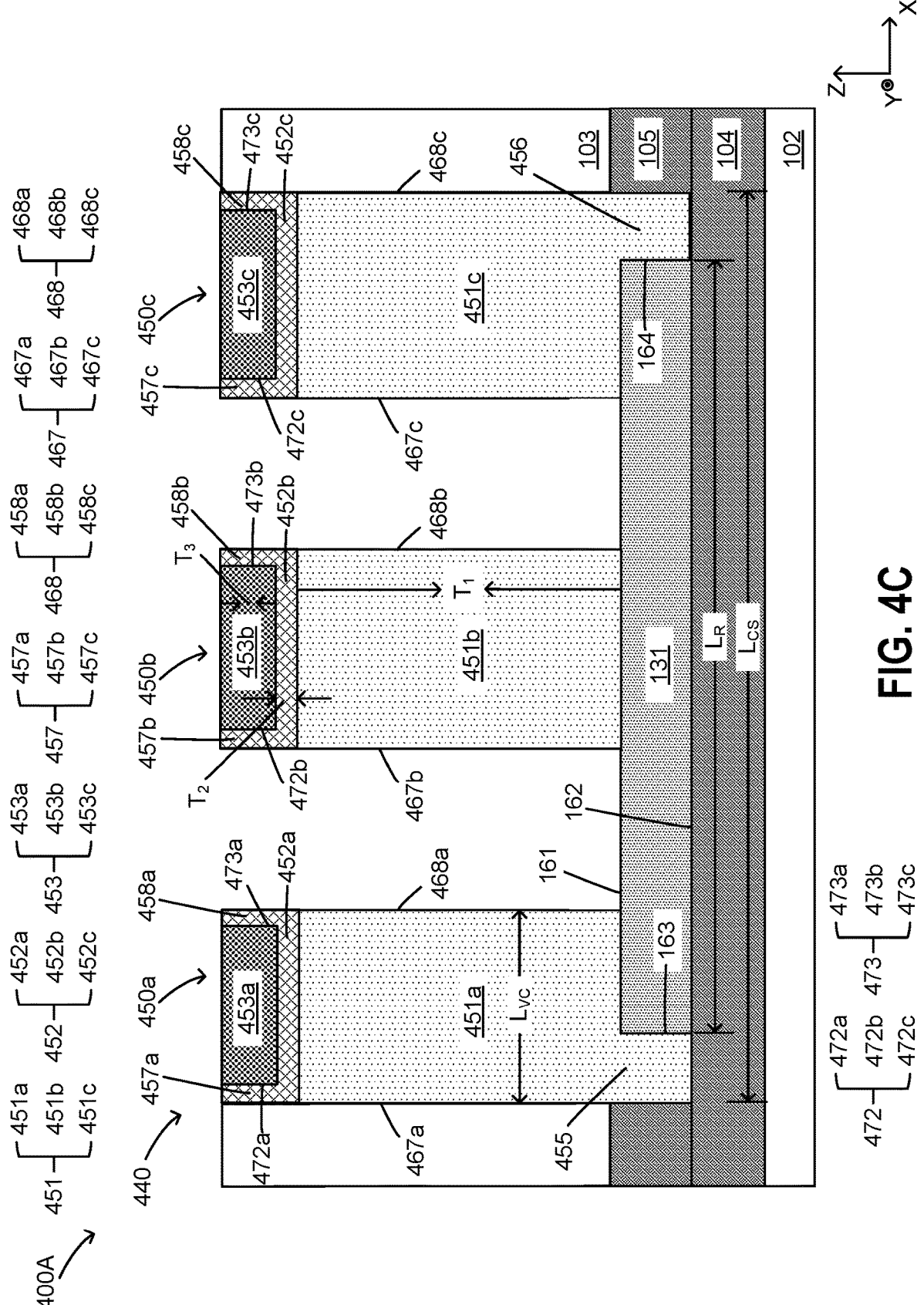
FIG. 4C is a schematic diagram illustrating a cross-sectional view of a region of the semiconductor structure of FIG. 4A, in accordance with some embodiments.

FIGS. 4A-4C illustrate an example semiconductor structure 400A including a resistor contact structure 440 (also referred to as a "contact structure," a "contact assembly," or an equivalent thereof) disposed on a resistor 131 in accordance with some embodiments of the present disclosure. FIG. 4A illustrates a cross-sectional view of the semiconductor structure 400A. FIG. 4B illustrates a top view of a layout of a region 430 of the semiconductor structure 400A and the position of the resistor contact structure 440 relative to the resistor 131. FIG. 4C illustrates a cross-sectional view of the region 430 of the semiconductor structure 400A along the line A-A' of FIG. 4B. The semiconductor structure 400A is a close variation of the semiconductor structure 100A shown in FIGS. 1A-1C and may include any one or more of the components thereof. Details of the components of the semiconductor structure 400A will not be repeated here unless otherwise indicated.

In the illustrated example, the resistor contact structure 440 includes multiple resistor via contacts 450 (e.g., resistor via contacts 450a, 450b, and 450c) arranged in a row and aligned in the X-direction. Generally, each resistor via contact 450 is similar to the resistor via contact 150 of FIGS. 1A-1C and has a relatively smaller length $(L_{VC})$. Specifically, each resistor via contact 450 (i.e., 450a, 450b, and 450c) extends from a first side 467 (i.e., 467a, 467b, and 467c) to a second side 468 (i.e., 468a, 468b, and 468c) in the X-direction. Each resistor via contact 450 (i.e., 450a, 450b, and 450c) includes a first layer 451 (i.e., 451a, 451b, and 451c), a second layer 452 (i.e., 452a, 452b, and 452c), and a third layer 453 (i.e., 453a, 453b, and 453c). The first layers 451a and 451c respectively cover a portion of the first end 163 and a portion of the second end 164 of the resistor 131. The first layer 451a of the resistor via contact 450a has a bottom portion 455 disposed on the first end 163 of the resistor 131, and the first layer 451c of the resistor via contact 450c has a bottom portion 456 disposed on the second end 164 of the resistor 131. In some embodiments, the $L_{VC}$ of each resistor via contact 450 is from about 3 nm to about 600 nm, from about 3 nm to about 400 nm, from about 3 nm to about 200 nm, from about 3 nm to about 100 nm, from about 3 nm to about 50 nm, or from about 3 nm to about 20 nm. In some embodiments, the total length $(L_{CS})$ of the resistor contact structure 440, as measured by a distance from the first side 467a of the resistor via contact 450a to the second side 468c of the resistor via contact 450c, is from about 3 nm to about 2,000 nm. In some embodiments, a ratio of $L_{VC}$ to $L_{CS}$ $(L_{VC}/L_{CS})$ is 0.3 or less, 0.2 or less, 0.1 or less, 0.05 or less. The number of the resistor via contacts 450 included in the resistor contact structure 440 may vary, from 2 to 100.

Figure 4D:
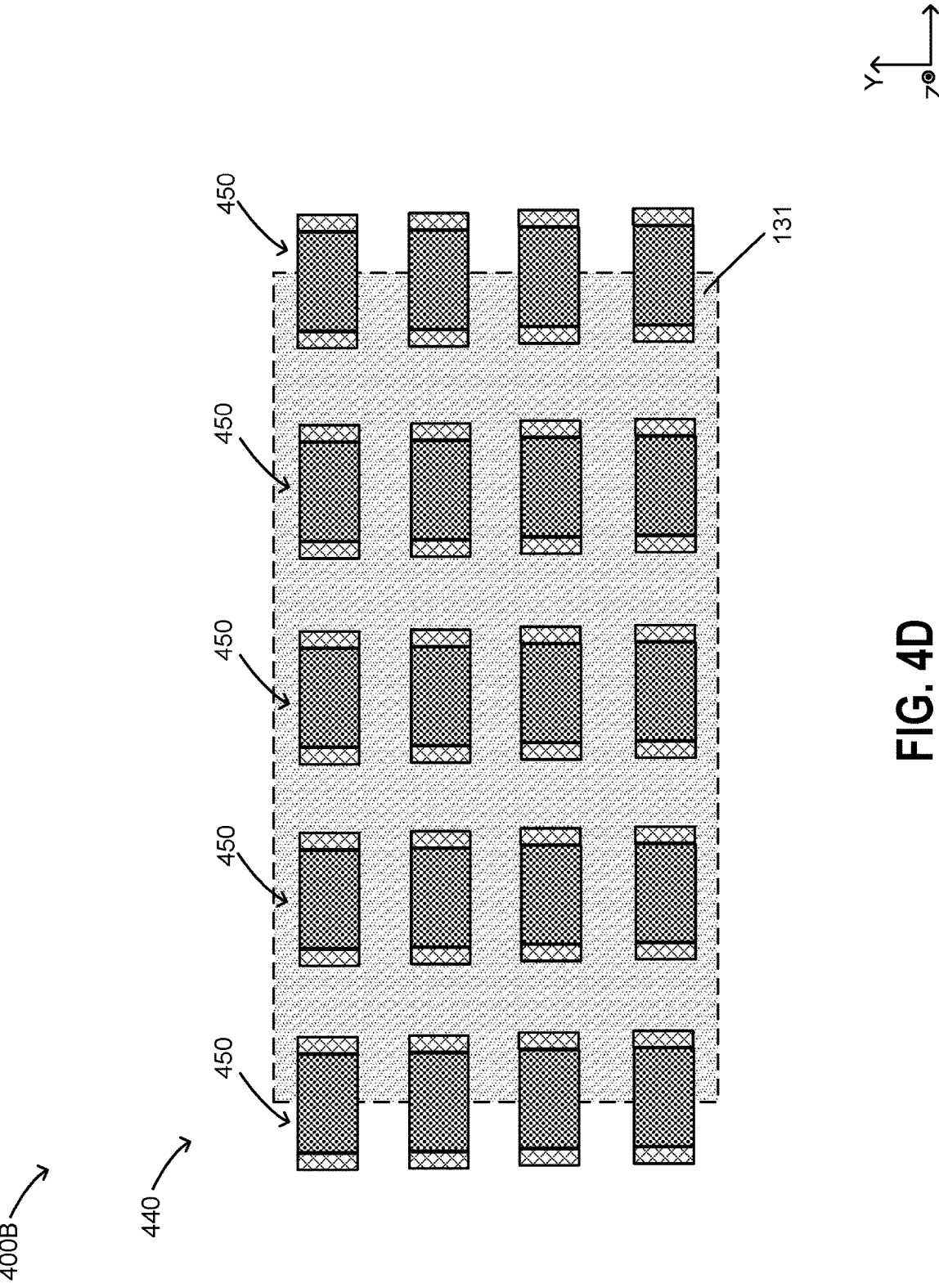
FIG. 4D is a schematic diagram illustrating a top view of another example semiconductor structure, in accordance with some embodiments.

FIG. 4D illustrates a top view of a layout of another example semiconductor structure 400B according to some embodiments. The semiconductor structure 400B is a close variation of the semiconductor structure 400A shown in FIGS. 4A-4C and may include any one or more components of the semiconductor structure 400A described above. In the illustrated example, the semiconductor structure 400B includes, among other components, a resistor 131 and a resistor contact structure 440 disposed over the resistor 131. The resistor contact structure 440 include an array of resistor via contacts 450 arranged in rows and columns in the X-Y plane. The array of resistor via contacts 450 may form a regular or irregular pattern. Details of the resistor via contacts 150 are described above with reference to FIGS. 1B-1C and will not be repeated here. The number of the resistor via contacts 150 may vary, for example, from 2 to 100.

Figure 5:
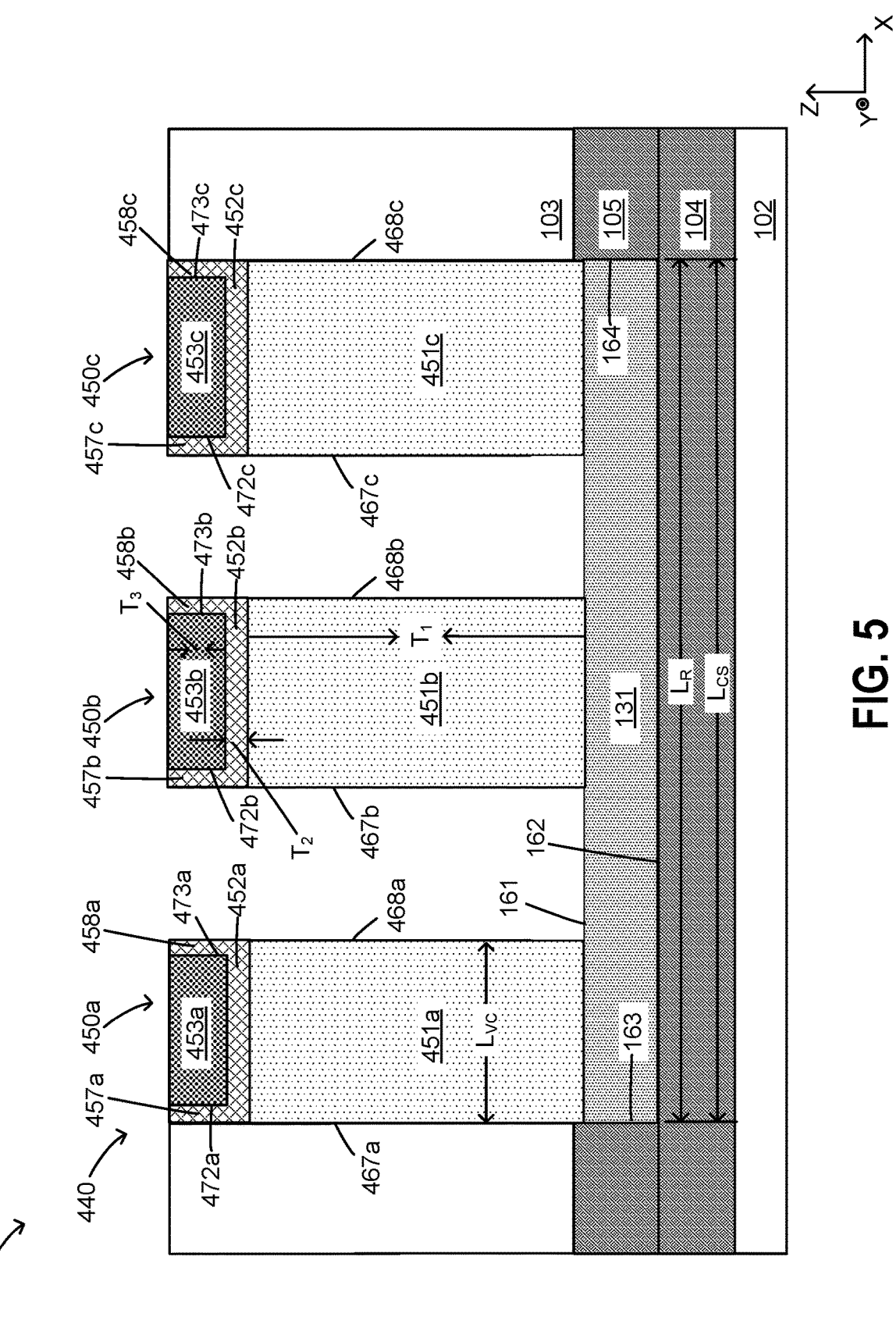
FIG. 5 is a schematic diagram illustrating a cross-sectional view of another example semiconductor structure, in accordance with some embodiments.

FIG. 5 illustrates a cross-sectional view of another example semiconductor structure 500 according to some embodiments. The semiconductor structure 500 is a variation of the semiconductor structures 400A and 400B shown in FIGS. 4A-4D and may include any one or more components of the semiconductor structures 400A and 400B described above. Details of the components of the semiconductor structure 500 will not be repeated unless otherwise indicated. In the illustrated example, the total length $(L_{CS})$ of the resistor contact structure 440 is substantially the same as the $L_R$ of the resistor 131. In other words, the first side 467a of the resistor via contact 450a and the second side 468c of the resistor via contact 450c are respectively aligned with the first end 163 and the second end 164 of the resistor 131. Both first layers 151a and 151c do not have a side portion that covers the first end 163 or the second end 164 of the resistor 131.

Figure 6:
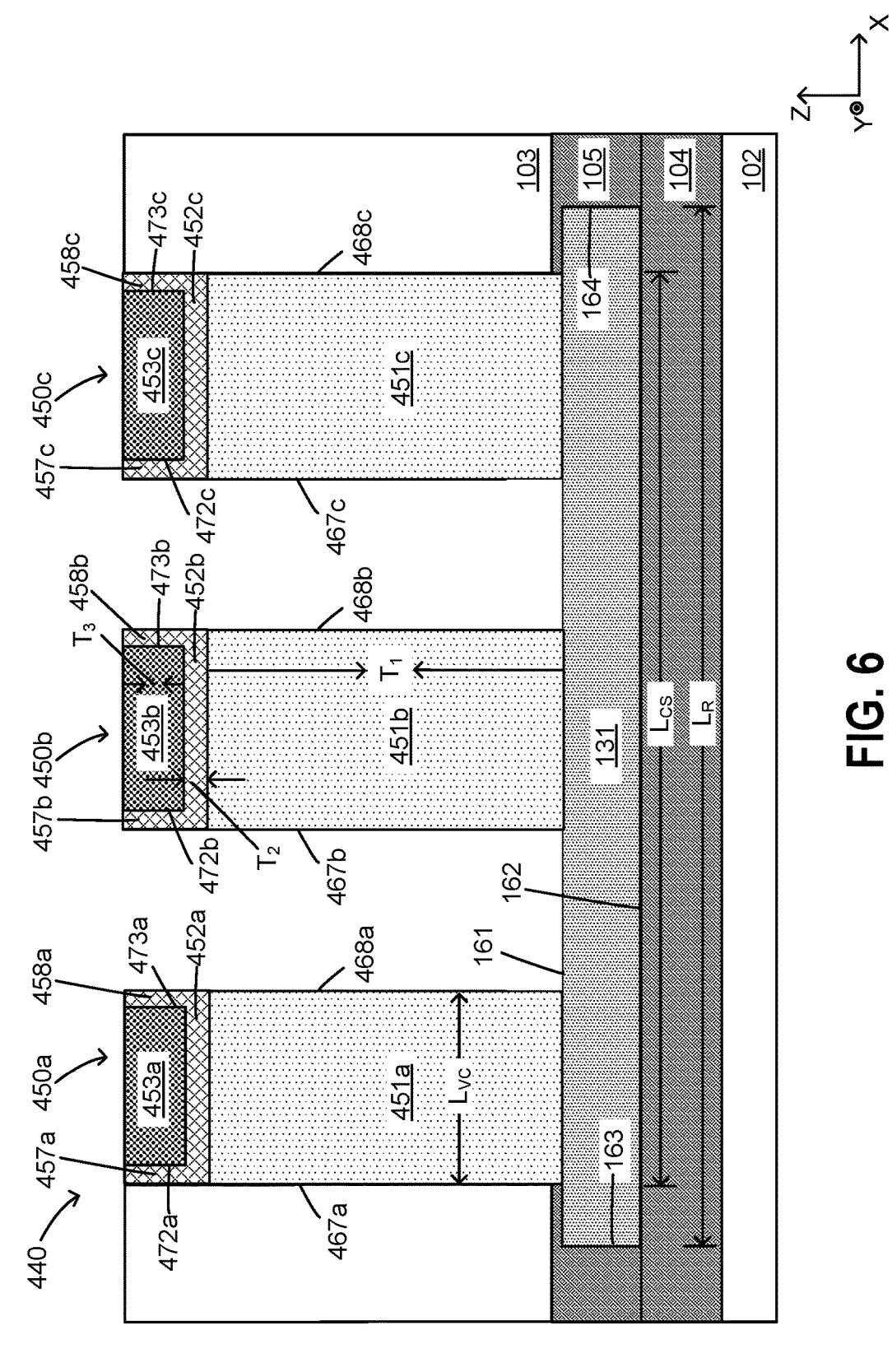
FIG. 6 is a schematic diagram illustrating a cross-sectional view of another example semiconductor structure, in accordance with some embodiments.

FIG. 6 illustrates a cross-sectional view of another example semiconductor structure 300 according to some embodiments. The semiconductor structure 600 is a variation of the semiconductor structure 500 shown in FIG. 5 and may include any one or more components of the semiconductor structure 500 described above. Details of the components of the semiconductor structure 600 will not be repeated unless otherwise indicated. In the illustrated example, the resistor contact structure 440 has a length $(L_{CS})$ that is less than the $L_R$ of the resistor 131. In some embodiments, a ratio of $L_{CS}$ to $L_R$ $(L_{CS}/L_R)$ is at least 0.5, at least 0.6, at least 0.7, at least 0.8, or at least 0.9.

Figure 7A:
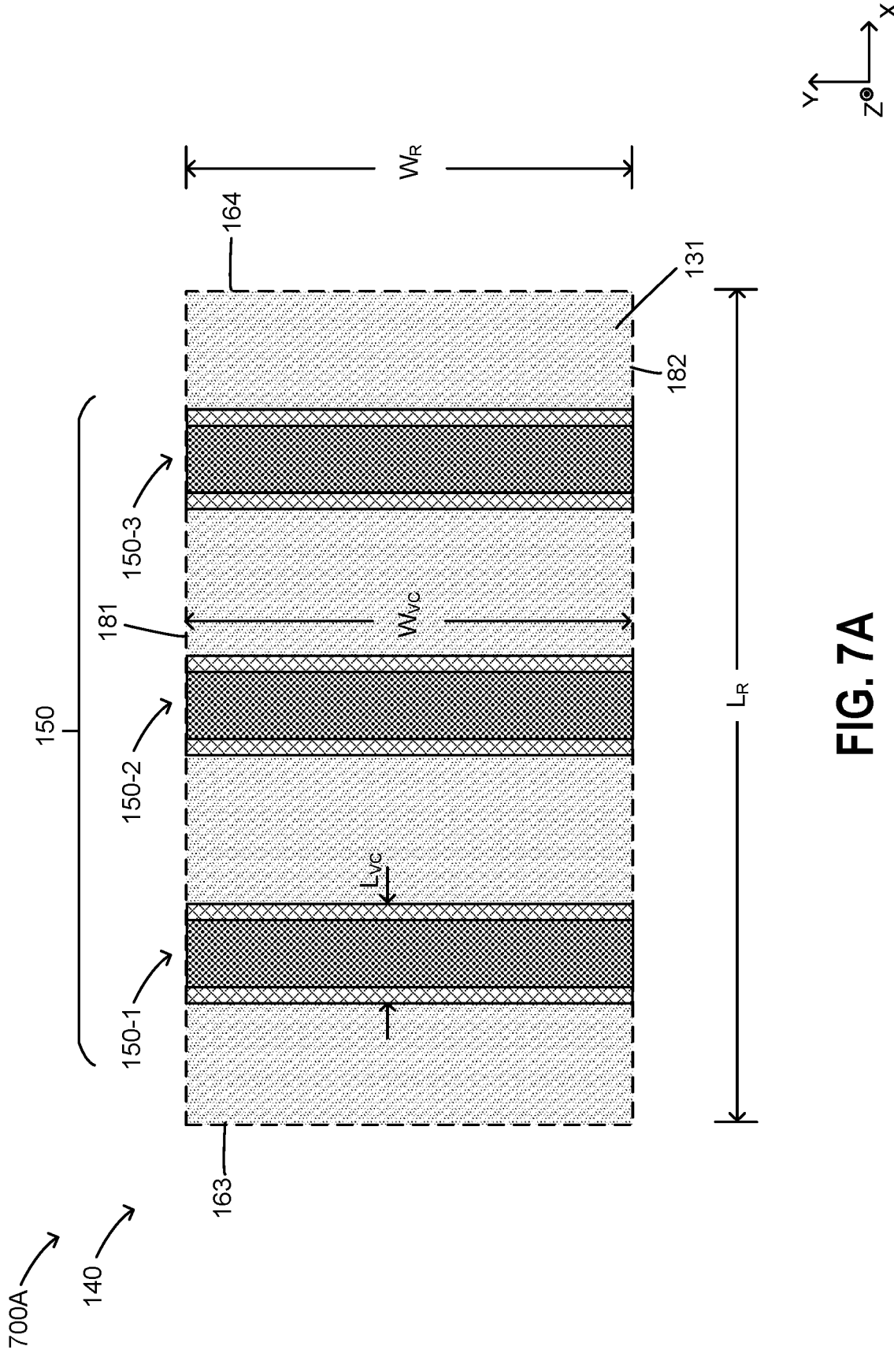
FIG. 7A is a schematic diagram illustrating a top view of another example semiconductor structure, in accordance with some embodiments.
Figure 7B:
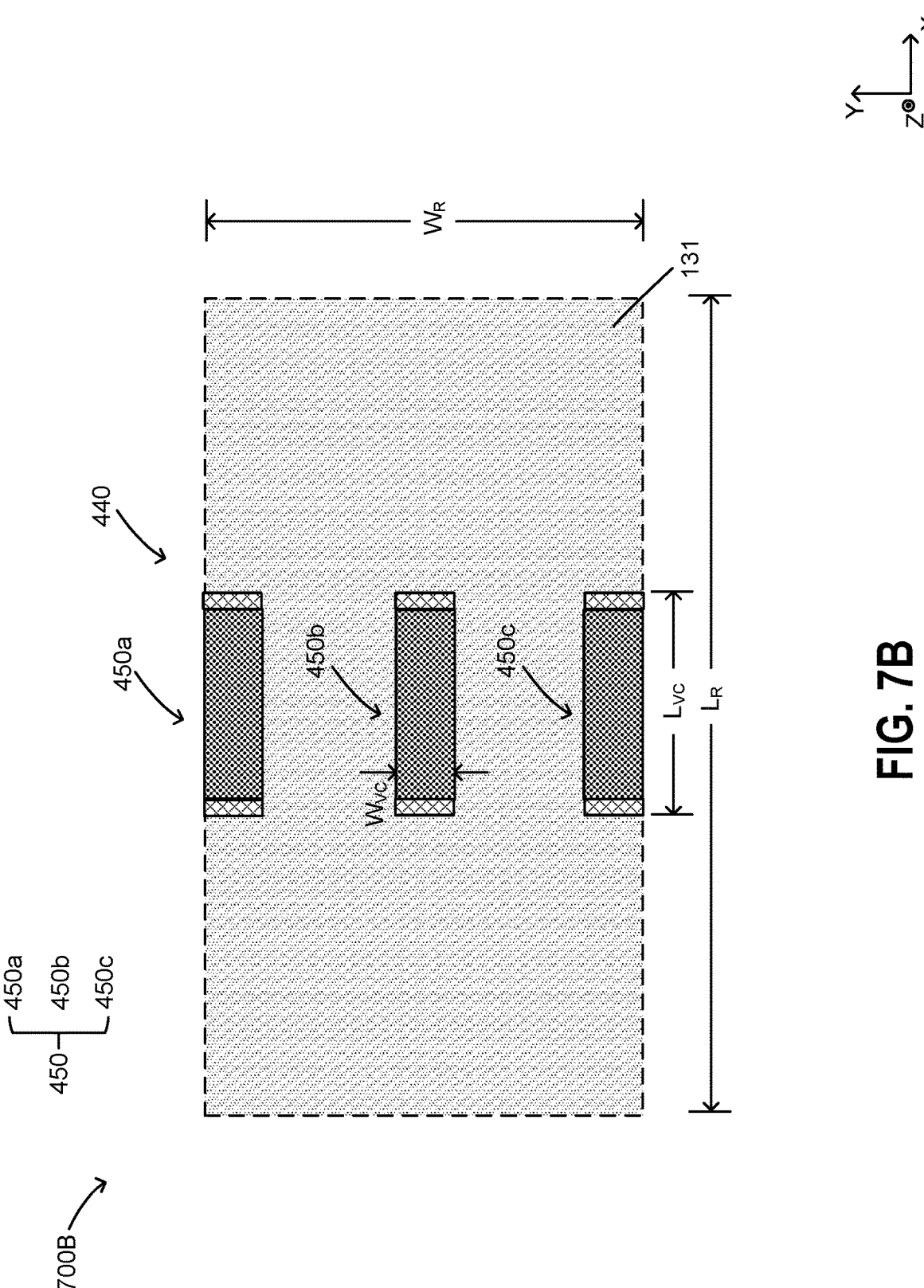
FIG. 7B is a schematic diagram illustrating a top view of another example semiconductor structure, in accordance with some embodiments.

FIGS. 7A-7B illustrate additional examples of semiconductor structures 700A and 700B, respectively. FIG. 7A is a top view illustrating a layout of an example semiconductor structure 700A, which is a close variation of the semiconductor structure 100A. In the illustrated example, the semiconductor structure 700A includes a resistor 131 and a resistor contact structure 140 disposed on the resistor 131. The resistor contact structure 140 includes multiple resistor via contacts 150 (e.g., resistor via contacts 150-1, 150-2, and 150-3) that are parallelly arranged in a row along the X-direction. Each resistor via contact 150 extends continuously from the first side 181 to the second side 182 of the resistor 131 along the Y-direction. Each resistor via contact 150 has a length $(L_{VC})$ substantially smaller than the $L_R$ of the resistor 131 and a width $(W_{VC})$ substantially the same as the $W_R$ of the resistor 131. The total number of resistor via contacts 150 included in the resistor contact structure 140 may vary from 2 to 100.

FIG. 7B is a top view illustrating a layout of an example semiconductor structure 700B, which is a close variation of the semiconductor structure 400A. In the illustrated example, the semiconductor structure 700B includes a resistor 131 and a resistor contact structure 440 disposed on the resistor 131. The resistor contact structure 440 includes multiple resistor via contacts 450 (e.g., resistor via contacts 450a, 450b, and 450c) that are parallelly arranged in a column along the Y-direction. Each resistor via contact 450 has a length $(L_{VC})$ substantially smaller than the $L_R$ and a width $(W_{VC})$ substantially smaller than the $W_R$. The total number of resistor via contacts 450 included in the resistor contact structure 440 may vary from 2 to 100.

Figure 8:
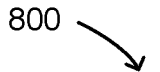
FIG. 8 is a flow diagram illustrating an example method for fabricating a semiconductor structure, in accordance with some embodiments.
Figure 8:
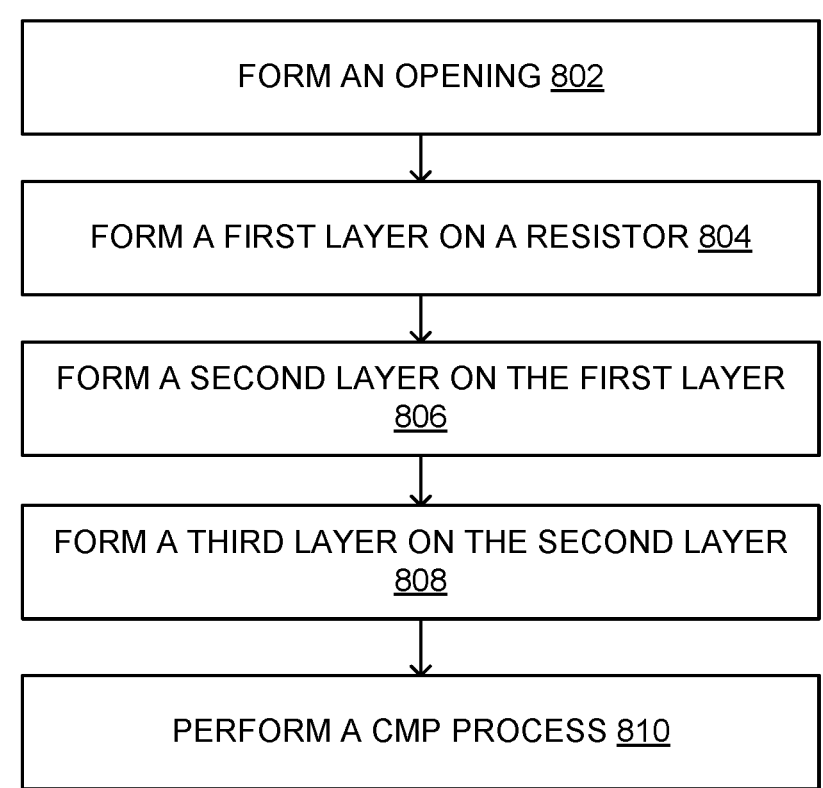

FIG. 8 is a flow diagram illustrating a method 800 for forming a semiconductor structure having a resistor contact structure according to some embodiments. In the example shown in FIG. 8, the method 800 includes operations 802, 804, 806, 808, and 810. Additional operations may be performed.

At 802, an opening is formed. The opening may be formed over a resistor (e.g., the resistor 131 of FIG. 1A) of a semiconductor structure (e.g., the semiconductor structure 100A) to expose a top surface of the resistor. In some embodiments, multiple openings (e.g., a row or column or array or pattern of multiple openings) are formed over the resistor. The opening(s) may be formed using a patterning and etching process.

At 804, a first layer is formed in the opening. The first layer (e.g., the first layer 151 of FIG. 1A) is formed in the opening using a suitable deposition technique such as CVD, PVD, and ALD. In some embodiments, a first layer (e.g., the first layer 451 of FIG. 4A) is formed in each opening of the multiple openings. In some embodiments, the first layer may be formed simultaneously with the formation of other conductive features (e.g., the conductive features 112 of FIGS. 1A and 4A) during the same deposition process.

At 806, a second layer is formed on the first layer. The second layer (e.g., the second layer 152 of FIG. 1A) may be formed on the first layer in the opening using a suitable deposition technique. In some embodiments, a second layer (e.g., the second layer 452 of FIG. 4A) is formed on the first layer in each one of the multiple openings.

At 808, a third layer is formed on the second layer. The third layer (e.g., the third layer 153 of FIG. 1A) may be formed on the second layer in the opening using a suitable deposition technique. In some embodiments, a third layer (e.g., the third layer 453 of FIG. 4A) is formed on the second layer in each one of the multiple openings.

At 810, a planarization process (e.g., a CMP process) is performed to remove excess material of the third layer and generate a smooth and substantially flat surface of the third layer. A resistor contact structure (e.g., the resistor contact structure 140 of FIG. 1A or 440 of FIG. 4A) is thereby formed.

It should be noted the example via contacts and contact structures according to the present disclosure are not intended to be limited to provide connectivity for resistors only. The via contacts and contact structures can be generally applicable as improved conductive interconnect features for other types of active and passive devices.

SUMMARY

In accordance with some aspects of the disclosure, a semiconductor structure is provided. In one example, the semiconductor structure includes a substrate, a dielectric layer disposed over the substrate, a resistor disposed in the dielectric layer and extending in a first horizontal direction from a first sidewall to a second sidewall, and a resistor via contact disposed in the dielectric layer the resistor. The resistor via contact further includes a first layer disposed on and in contact with the resistor, a second layer disposed on and in contact with the first layer, and a third layer disposed on and in contact with the second layer. The first layer has a first thickness and includes a first material having a first resistivity, the second layer has a second thickness and includes a second material, and the third layer has a third thickness and includes a third material having a second resistivity. The first thickness is more than the third thickness, and the first resistivity is less than the second resistivity.

In another example, a semiconductor structure includes a substrate, a dielectric layer disposed over the substrate, a resistor disposed in the dielectric layer and extending in a first horizontal direction from a first sidewall to a second sidewall, and a resistor contact structure disposed on the resistor. The resistor contact structure further includes multiple resistor via contacts disposed in the dielectric layer and spaced from each other, wherein each one of the resistor via contacts extends in the first horizontal direction from a first side to a second side and further includes a first layer disposed on and in contact with the resistor, a second layer disposed on and in contact with the first layer, and a third layer disposed on and in contact with the second layer. The first layer has a first thickness and includes a first material having a first resistivity, the second layer has a second thickness and includes a second material, and the third layer has a third thickness and includes a third material having a second resistivity. The first thickness is more than the third thickness, and the first resistivity is less than the second resistivity.

In a further example, a semiconductor structure includes a substrate, a dielectric layer disposed over the substrate, a resistor disposed in the dielectric layer and extending in a first horizontal direction from a first sidewall to a second sidewall, and a resistor contact structure disposed in the dielectric layer. The resistor contact structure further includes multiple resistor via contacts arranged and aligned in a column along a second horizontal direction substantially perpendicular to the first horizontal direction. Each one of the resistor via contacts extends continuously in the first horizontal direction from a first side to a second side and further includes a first layer disposed on and in contact with the resistor, a second layer disposed on and in contact with the first layer, and a third layer disposed on and in contact with the second layer. The first layer has a first thickness and includes a first material having a first resistivity, the second layer has a second thickness and includes a second material, and the third layer has a third thickness and includes a third material having a second resistivity. The first thickness is more than the third thickness, the third thickness is more than the second thickness, and the first resistivity is less than the second resistivity by at least 10%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a dielectric layer disposed over the substrate;
   a resistor disposed in the dielectric layer, the resistor extending in a first horizontal direction from a first sidewall to a second sidewall; and
   a resistor via contact disposed in the dielectric layer, wherein the resistor via contact extends continuously in the first horizontal direction from a first side to a second side and further comprises:
      a first layer disposed on and in contact with the resistor, wherein the first layer has a first thickness and includes a first material having a first resistivity, and wherein the first layer is an electrically conductive layer;
      a second layer disposed on and in contact with the first layer, wherein the second layer has a second thickness and includes a second material; and a third layer disposed on and in contact with the second layer, wherein the third layer has a third thickness and includes a third material having a second resistivity, wherein the first thickness is more than the third thickness, and the first resistivity is less than the second resistivity.

2. The semiconductor structure of claim 1, wherein the resistor via contact has a length ($L_{VC}$) measured by a distance between the first side and the second side, and $L_{VC}$ is from 3 nm to 2,000 nm.

3. The semiconductor structure of claim 2, wherein the resistor has a length ($L_R$) measured by a distance between the first sidewall and the second sidewall, and $L_R$ is less than $L_{VC}$.

4. The semiconductor structure of claim 2, wherein the first layer of the resistor via contact further comprises a main portion disposed on a top surface of the resistor and two side portions respectively disposed on the first and second sidewalls of the resistor.

5. The semiconductor structure of claim 1, wherein the resistor has a thickness ($T_R$) of at least 1 nm.

6. The semiconductor structure of claim 1, wherein the first thickness is from 0.3 nm to 100 nm, the second thickness is from 0 to 20 nm, and the third thickness is from 0 to 50 nm.

7. The semiconductor structure of claim 1, wherein the first material and the third material each independently include at least one of W, Mn, Cu, Ag, Co, Ni, Ti, Ta, or a combination thereof, and the second material includes at least one of Ti, Ta, Ni, Co, W, Mn, Cu, Ag, Si, or any combinations thereof.

8. The semiconductor structure of claim 1, wherein both the first material and the third material include a metal, the first material has a first crystal structure of the metal, the third material has a second crystal structure of the metal, and the first crystal structure is different from the second crystal structure.

9. The semiconductor structure of claim 1, wherein both the first material and the third material include a metal having a first crystal structure and a second crystal structure, the first material has a first mass ratio of the first crystal structure to the second structure, the third material has a second mass ratio of the first crystal structure to the second crystal structure, the first mass ratio is more than 1, and the second mass ratio is less than 1.

10. The semiconductor structure of claim 1, wherein the first resistivity is at least 10% less than the second resistivity.

11. A semiconductor structure, comprising:

a substrate;

a dielectric layer disposed over the substrate;

a resistor disposed in the dielectric layer, the resistor extending in a first horizontal direction from a first sidewall to a second sidewall;

a resistor contact structure comprising a plurality of resistor via contacts disposed in the dielectric layer, wherein each one of the plurality of resistor via contacts extends in the first horizontal direction from a first side to a second side and further comprises:

a first layer disposed on and in contact with the resistor, wherein the first layer has a first thickness and includes a first material having a first resistivity, and wherein the first layer is an electrically conductive layer;

a second layer disposed on and in contact with the first layer, wherein the second layer has a second thickness and includes a second material; and a third layer disposed on and in contact with the second layer, wherein the third layer has a third thickness and includes a third material having a second resistivity, wherein the first thickness is more than the third thickness, and the first resistivity is less than the second resistivity.

12. The semiconductor structure of claim 11, wherein the plurality of resistor via contacts are arranged in a row and aligned in the first horizontal direction.

13. The semiconductor structure of claim 11, wherein the plurality of resistor via contacts are arranged in a column and aligned in a second horizontal direction substantially perpendicular to the first horizontal direction.

14. The semiconductor structure of claim 11, wherein the plurality of resistor via contacts are arranged in rows and columns in a horizontal plane.

15. The semiconductor structure of claim 13, wherein a total number of the resistor via contacts is at least 9.

16. The semiconductor structure of claim 11, wherein the second material is a mixture of the first material and the third material.

17. The semiconductor structure of claim 11, wherein each of the plurality of resistor via contacts has a total thickness, measured by a sum of the first thickness, second thickness, and the third thickness, from 0.3 nm to 170 nm.

18. A semiconductor structure, comprising:

a substrate;

a dielectric layer disposed over the substrate;

a resistor disposed in the dielectric layer, the resistor extending in a first horizontal direction from a first sidewall to a second sidewall;

a resistor contact structure disposed in the dielectric layer, wherein the resistor contact structure comprises a plurality of resistor via contacts arranged and aligned in a column along a second horizontal direction substantially perpendicular to the first horizontal direction, each one of the plurality of resistor via contacts extends continuously in the first horizontal direction from a first side to a second side and further comprises:

a first layer disposed on and in contact with the resistor, wherein the first layer has a first thickness and includes a first material having a first resistivity, and wherein the first layer is an electrically conductive layer;

a second layer disposed on and in contact with the first layer, wherein the second layer has a second thickness and includes a second material; and a third layer disposed on and in contact with the second layer, wherein the third layer has a third thickness and includes a third material having a second resistivity, wherein the first thickness is more than the third thickness, the third thickness is more than the second thickness, and the first resistivity is less than the second resistivity by at least 10%.

19. The semiconductor structure of claim 18, wherein a total number of the resistor via contacts is at least 3.

20. The semiconductor structure of claim 18, wherein the resistor has a length ($L_R$) measured by a distance between the first sidewall and the second sidewall, the resistor via contact has a length ($L_{VC}$) measured by a distance between the first side and the second side, and $L_R$ is larger than $L_{VC}$.

* * * * *